United States Patent
Chidambarrao et al.

(10) Patent No.: US 7,979,815 B2
(45) Date of Patent: Jul. 12, 2011

(54) COMPACT MODEL METHODOLOGY FOR PC LANDING PAD LITHOGRAPHIC ROUNDING IMPACT ON DEVICE PERFORMANCE

(75) Inventors: Dureseti Chidambarrao, Weston, CT (US); Gerald M. Davidson, Essex Junction, VT (US); Paul A. Hyde, Essex Junction, VT (US); Judith H. McCullen, Essex Junction, VT (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 724 days.

(21) Appl. No.: 11/970,990

(22) Filed: Jan. 8, 2008

(65) Prior Publication Data
US 2009/0177448 A1    Jul. 9, 2009

(51) Int. Cl.
*G06F 17/50* (2006.01)
*G06F 9/45* (2006.01)

(52) U.S. Cl. .......... 716/101; 716/50; 716/100; 716/106; 716/108; 716/111; 716/112; 716/113; 716/132; 716/136; 703/4; 703/13; 703/15

(58) Field of Classification Search ................... 716/1, 2, 716/4, 5, 6, 19; 703/4, 13, 15
See application file for complete search history.

(56) References Cited

U.S. PATENT DOCUMENTS

| | | | |
|---|---|---|---|
| 6,246,973 B1 * | 6/2001 | Sekine | 703/4 |
| 7,337,420 B2 * | 2/2008 | Chidambarrao et al. | 716/8 |
| 2004/0153986 A1 * | 8/2004 | Sahara et al. | 716/10 |
| 2005/0251771 A1 * | 11/2005 | Robles | 716/5 |
| 2006/0273266 A1 * | 12/2006 | Preil et al. | 250/548 |
| 2007/0291828 A1 * | 12/2007 | Martin et al. | 375/219 |
| 2008/0104550 A1 * | 5/2008 | Sultan et al. | 716/2 |
| 2009/0108305 A1 * | 4/2009 | Riviere-Cazaux et al. | 257/288 |
| 2009/0160027 A1 * | 6/2009 | Park et al. | 257/618 |
| 2009/0222785 A1 * | 9/2009 | Cheng et al. | 716/19 |

* cited by examiner

*Primary Examiner* — Helen Rossoshek
(74) *Attorney, Agent, or Firm* — Scully, Scott, Murphy & Presser, P.C.; Joseph P. Abate, Esq.

(57) ABSTRACT

A method and computer program product for modeling a semiconductor transistor device structure having an active device area, a gate structure, and including a conductive line feature connected to the gate structure and disposed above the active device area, the conductive line feature including a conductive landing pad feature disposed near an edge of the active device area in a circuit to be modeled. The method includes determining a distance between an edge defined by the landing pad feature to an edge of the active device area, and, from modeling a lithographic rounding effect of the landing pad feature, determining changes in width of the active device area as a function of the distance between an edge defined by the landing pad feature to an edge of the active device area. From these data, an effective change in active device area width (deltaW adder) is related to the determined distance.

28 Claims, 6 Drawing Sheets

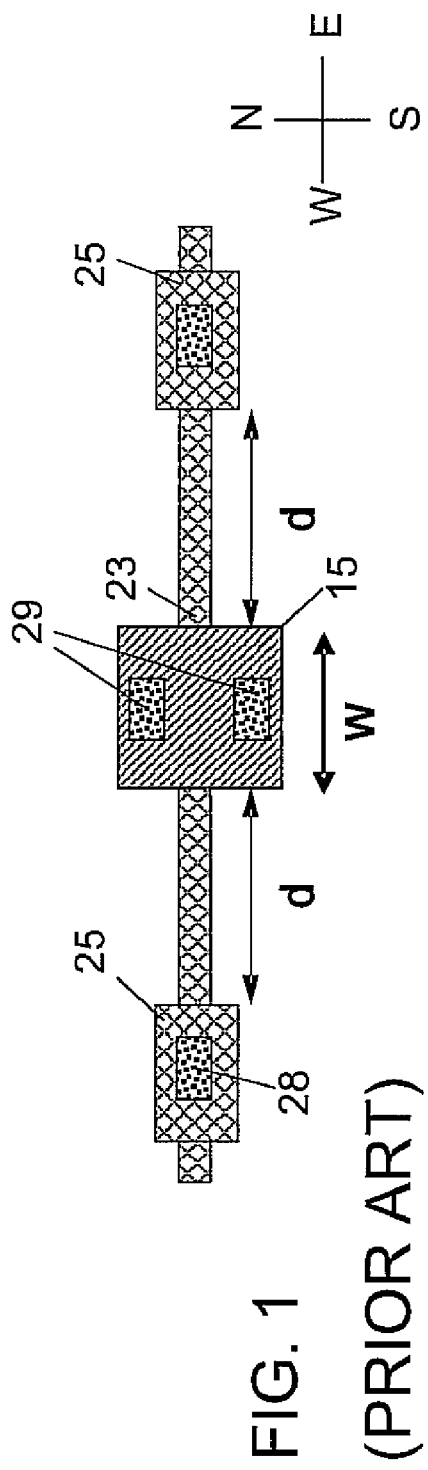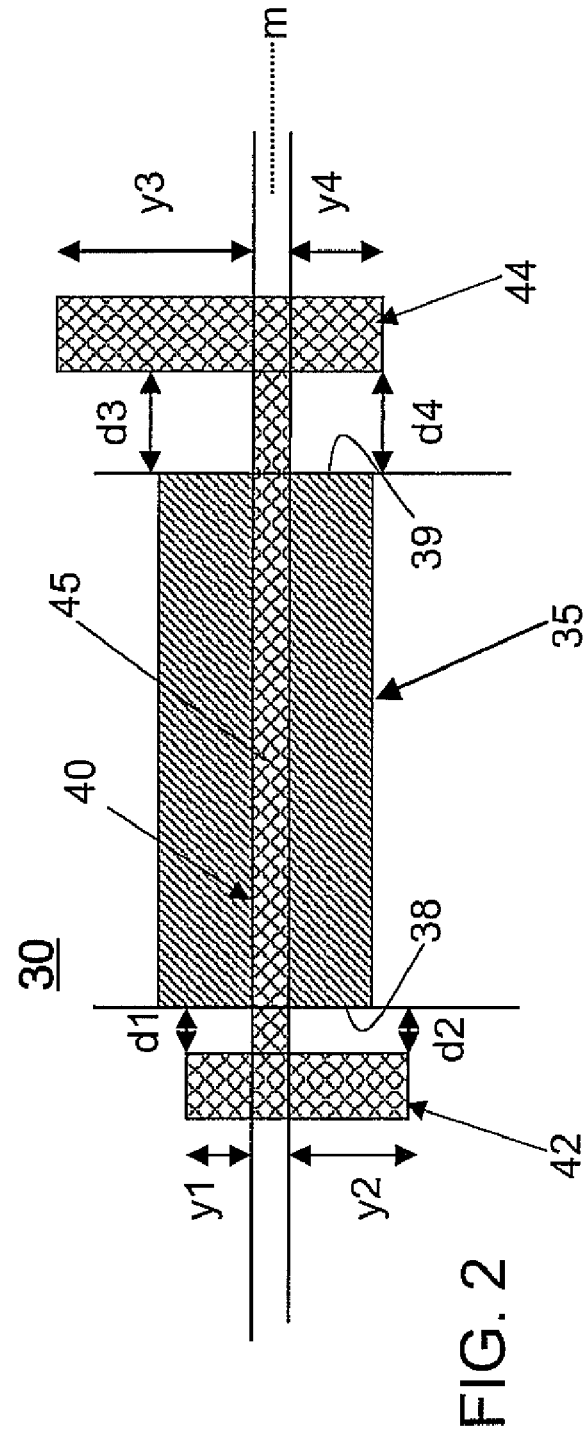
FIG. 1 (PRIOR ART)
FIG. 2

COMPACT MODEL METHODOLOGY FOR PC LANDING PAD LITHOGRAPHIC ROUNDING IMPACT ON DEVICE PERFORMANCE

FIELD OF THE INVENTION

The present invention relates to a novel method and system for optimizing integrated circuit layouts, generally, and particularly, a system and method for modeling performance of a semiconductor device structure for achieving modified ground rules for lithographic feature distances that optimize semiconductor device performance.

DESCRIPTION OF PRIOR ART

Lithographic constraints are important factors in determining the efficiency of a circuit layout. In essence, lithographic constraints are conventionally determined by the generally limited capability of a lithographic process to successfully print line features at specified positions within tolerances. A lithographic process involves using a lithographic exposure tool to illuminate a lithographic mask from a range of directions, and focusing a projected image of the mask onto a photosensitive film that coats a partially fabricated integrated circuit on a wafer, such as a silicon wafer. Lithographic process window represents the range of delivered light energy (dose) and image plane defocus within which the projected image adequately represents the desired circuit shapes. After the image is formed, the photosensitive film is developed, and the printed pattern is transferred into a functional process layer in the circuit. The final circuit then consists of many such patterned levels stacked atop one another.

FIG. 1 shows an example portion of a semiconductor device structure 10, e.g., including a FET device such as a pFET, suitable for characterizing a lithographic process impact on device performance. FIG. 1 illustrates a device structure 10 that includes an active device region (RX) 15 formed on a semiconductor substrate that comprises, for example, a polysilicon gate or gate stack (not shown) that separates source and drain regions (not shown).

As shown in FIG. 1, the active device area is characterized as having a width dimension "W". A conductive wire or line layer (PC) comprising a conductive material, for example, polysilicon (with a silicided top) or metal gate, connects the gate to a landing pad region 25 formed at either side of the active device area 15. The polysilicon line layer (PC) includes an interconnect region 23 having a designed width and landing pad regions 25. Further as shown in FIG. 1 are formed metal contacts 28 for providing electrical contact to the landing pad 25 and, drain and source contact metallurgy 29 for providing electrical contact to the active devices as known in the art. Also shown in FIG. 1 the landing pad 25 is far away form the device active area 15. In the migration to 45 nm CMOS fabrication processes, in order to miniaturize the device, landing pad technology must allow for the shrinking of the feature size of device. However, the spacing between the landing pads has to be decreased so that they can provide enough areas for contact landing as the density of devices in a chip increases. This spacing is represented in FIG. 1 by the arrow labeled "d". The narrower the spacing, the more difficult it is to fabricate due to the limitations in overlay lithography. The landing pad 25 rounds during lithographic processing and if the distance "d" is small the rounded corner can straddle the device width and influence the device characteristics. In 65 nm technologies the distance "d" is typically large enough that any corner rounding does not come near the device to influence it. However, in 45 nm technologies given the need to increase density, the pads are getting close and d is small enough that the device is being impacted.

The PC landing pad 25 feature of the device structure 10 shown in FIG. 1, is known to influence the device performance. Therefore, it is the case that any compact modeling used needs to account for the device performance effect in the model. That is, the compact model for devices made according to 45 nm fabrication processes needs to account for this device performance effect.

Acceptable tolerances for the printed shapes must yield successful circuit performance, and must also be readily maintained under typical process variations. However, lithographic capability for printing a given feature edge is dependent on other features in the same local region of the circuit layout, as is circuit functionality. Consequently, lithographic constraints should ideally be very dynamic, and potentially incorporate and take advantage of the particular configurational details of large numbers of different local circuit cases.

Generally, however, due to general and practical design reasons, lithographic constraints are usually provided in a highly simplified form, known in the technology as design rules or ground rules, with these rules determining a lithographic capability, in effect, an achievable lithographic process window, which is at least acceptable in the technology, and these rules are normally employed for the entire circuit layout.

Thus, in view of the miniaturization of the device structure shown in FIG. 1, there is a need for a ground rule for landing pad to RX distance "d" at a point where device performance is negatively affected.

Moreover, it would be highly desirable to provide a method and system for more accurately modeling all device performance parametrics by taking into account the impact of lithographic corner rounding effects. Thus, the teachings of the present invention may be used to calculate other device parametrics, e.g., similar to Ion. For instance, the method of the invention may be used to model effects of corner rounding on Idlin, Ioff, Ieff, Gate capacitance, etc. One could also affect the impact of these device performance parametrics through various netlist parameters such as device channel length or threshold voltage (Vt) instead of device width W.

SUMMARY OF THE INVENTION

The present invention provides a system and method that addresses the above and other issues by providing a computationally efficient technique that accurately accounts for the shrinking of the size of device features in semiconductor devices.

In particular, the invention comprises methods and algorithms to account for the impact of differences in circuit landing pad feature sizes and distances to active device features, e.g., such as a transistor gate channel length, on circuit performance. Such methods and algorithms are implemented for obtaining the appropriate functional approximations and in extraction algorithms to obtain the correct geometric parameters.

Thus, in accordance with one aspect of the invention, there is provided a method and computer program product for modeling a semiconductor transistor device structure having an active device area, a gate structure, and including a conductive line feature connected to the gate structure and disposed above the active device area, the conductive line feature including a conductive landing pad feature disposed near an edge of the active device area. The method comprising the steps of:

determining a distance between an edge defined by the landing pad feature to an edge of the active device area;

determining from a modeling function that models a lithographic rounding effect of the landing pad feature, changes in width of the active device area as a function of the distance between an edge defined by the landing pad feature to an edge of the active device area; and, relating an effective change in active device area width (deltaW adder) with a distance from an edge defined by the first landing pad feature to an edge of the active device area of the transistor device being modeled; and, updating transistor model parameter values in a transistor compact model for the transistor device to include deltaW adder values to be added to a built-in deltaW value, wherein a netlist used in a simulation include the deltaW adder values to describe the characteristics of the transistor device, wherein effects of lithographic rounding effect of the first landing pad feature on transistor device parametrics is modeled.

Further to this aspect of the invention, the determining of changes in width of the active device area as a function of the distance between an edge defined by the landing pad feature to an edge of the active device comprises:

determining a polynomial function for calculating a lithographic rounding effect of the landing pad feature as a function of the distance;

obtaining a function representing a current flow modification created by the lithographic rounding effect as a function of an effective length of the conductive line feature;

providing the obtained current flow modification as a function of a width of the active device area; and, relating an effective change in active device area width (deltaW adder) with a distance from an edge defined by the first landing pad feature to an edge of the active device area of tie transistor device being modeled; and, updating transistor model parameter values in a transistor compact model for the transistor device to include deltaW adder values to be added to a built-in deltaW value, wherein a netlist used in a simulation include the deltaW adder values to describe the characteristics of the transistor device, wherein effects of lithographic rounding effect of the first landing pad feature on transistor device parametrics is modeled.

Further, in accordance with this aspect of the invention, the method step of obtaining a function representing a current flow modification comprises:

providing a current response function that models current flow through the gate structure as a function of the effective length of the conductive line feature; and, mixing the current response function with the first polynomial function.

Further, in accordance with this aspect of the invention, the modeling of the lithographic rounding effect according to the polynomial function comprises:

performing a lithographic contours analysis for providing input data to be used in the modeling, the input data for the analytical model representation comprising a distance "d" between an edge defined by the landing pad feature to an edge of the active device area.

Further, in accordance with this aspect of the invention, the input data for the analytical model representation comprises a corner jog length "y" between a top or bottom edge of a landing pad feature to an axis defined by the conductive line feature, the d and y lengths used in modeling the lithographic rounding effect.

Further, in accordance with this aspect of the invention, the conductive line feature connected to the gate structure extends beyond respective opposing edges of the active device area and includes first and second landing pad features each disposed proximate a respective edge of the active device area and each first and second landing pad feature having one or more corners defining a jog length, wherein the input data for the analytical model representation comprises determining a distance "d" between an edge defined by each the landing pad feature to an edge of the active device area and a respective jog length "y" for every corner defined by each the landing pad feature, the lithographic rounding effect calculated for each the corner of the landing pad feature based on the calculated distances.

Further, in accordance with this aspect of the invention, the polynomial function is a parabola.

In accordance with a further aspect of the invention, the polynomial function is a $n^{th}$ degree polynomial function, where "n" is a whole number.

In accordance with a further aspect of the invention, there is provided a method for improving accuracy of MOSFET models used in circuit simulation of integrated circuits, the method comprising:

receiving for a MOSFET design, a corresponding netlist used in circuit simulation, compact transistor models required by the netlists;

determining, from a modeling function that models a lithographic rounding effect of the landing pad feature, changes in width "W" of the active device area as a function of the distance between an edge defined by the landing pad feature to an edge of the active device area; and, adding, to the original netlist for the MOSFET design, values for updating the active device area widths used in a circuit simulation.

Further to this method, there is generated a new set of model parameters for the MOSFET using the original transistor models received and changes in a parameter W representing said change in width.

Further to this aspect of the invention, using said changes in parameter W for simulating different FET device parametrics including one or more of: Ieff current, Ion current, Idlin current, and gate capacitance.

Further to this aspect of the invention, besides device widths these parametric changes can be estimated as changes in device gate length (rather than width) of the active device as a function of the distance between an edge defined by the landing pad feature to an edge of the active device.

Further to this aspect of the invention, changes in other device parameters such as Vt rather than width can be implemented to simulate device parametrics (such as Ieff and Ioff) simultaneously as Vt accounts for these two effects together. Of course, saturated and linear Vts can be addressed independently.

Advantageously, calculation and modeling of the lithographic rounding effect of the landing pad feature may be advantageously used to generate netlist parameters suitable for simulating different currents and other modeled parameter features such as gate capacitance.

BRIEF DESCRIPTION OF THE DRAWINGS

Reference may now be made to the accompanying drawings in which:

FIG. 1 illustrates an example device structure 10 indicating the features from which the compact model methodology for PC landing pad lithographic rounding impact on device performance is determined in an exemplary embodiment of the invention;

FIG. 2 illustrates a generalized model 30 for determining effects of arbitrary edge shapes on various device parametrics according to the present invention;

DETAILED DESCRIPTION OF THE INVENTION

Figure 3A:
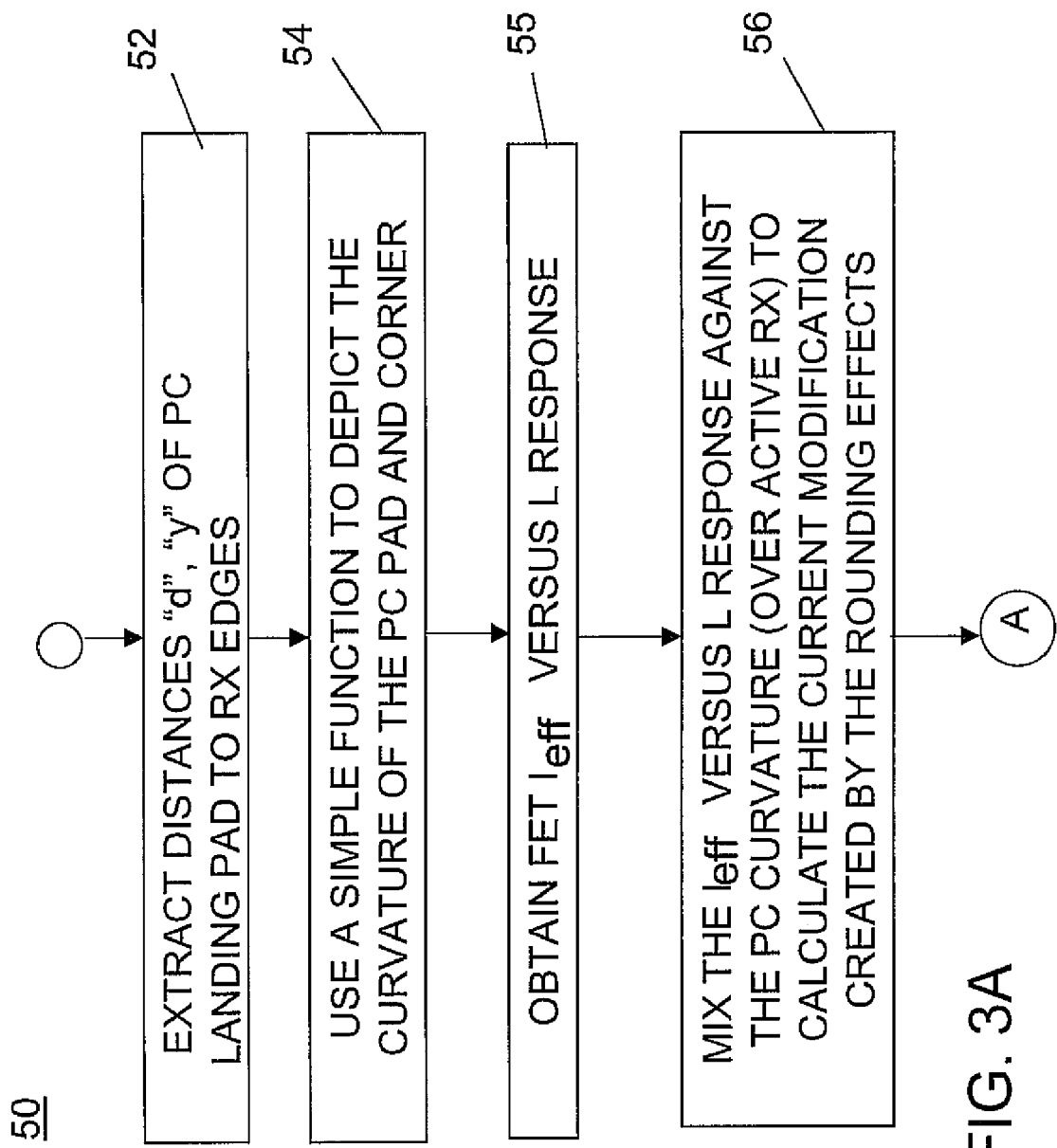
FIGS. 3A and 3B depict a methodology flow 50 according to one embodiment of the invention.

FIG. 2 depicts a generalized model 30 for determining effects of arbitrary edge shapes on various device parametrics according to the present invention. In the generalized model 30 shown in FIG. 2, there is assumed an RX (active semiconductor device area 35) and the PC landing pad structure 40, which, as shown in FIG. 2, is of arbitrary shape. For instance, in the generalized depiction 30 shown in FIG. 2, the model includes extracting the following dimensional values per device: $d_n$; where n=1, . . . ,4 and "d" represents the distance between the respective PC landing pad end region edges 42, 44 and the closest RX edge, e.g., d1, d2 with RX edge 38, and d3, d4, with RX edge 39. Further, in the generalized depiction 30 shown in FIG. 2, the model includes extracting the following additional dimensional values per device: $y_n$; n=1, . . . ,4 and "y" represents the corner length dimensions between a respective top and bottom of the landing pad end region edges to a midline axis of the PC landing pad structure, (e.g., structure 45 defining a midline axis m) with y1 and y3 representing respective distances from the top edges of PC landing pad regions 42 and 44 to the midline PC structure 45 and, with y2 and y4 representing respective distances from the bottom edges of PC landing pad regions 42 and 44 to the midline PC structure 45. These eight dimensional values $d_n$; where n=1, . . . ,4 and $y_n$; where n=1, . . . ,4 extracted per device as will be processed in the manner as described in greater detail herein below to determine the effect on the device parameters.

Figure 3B:
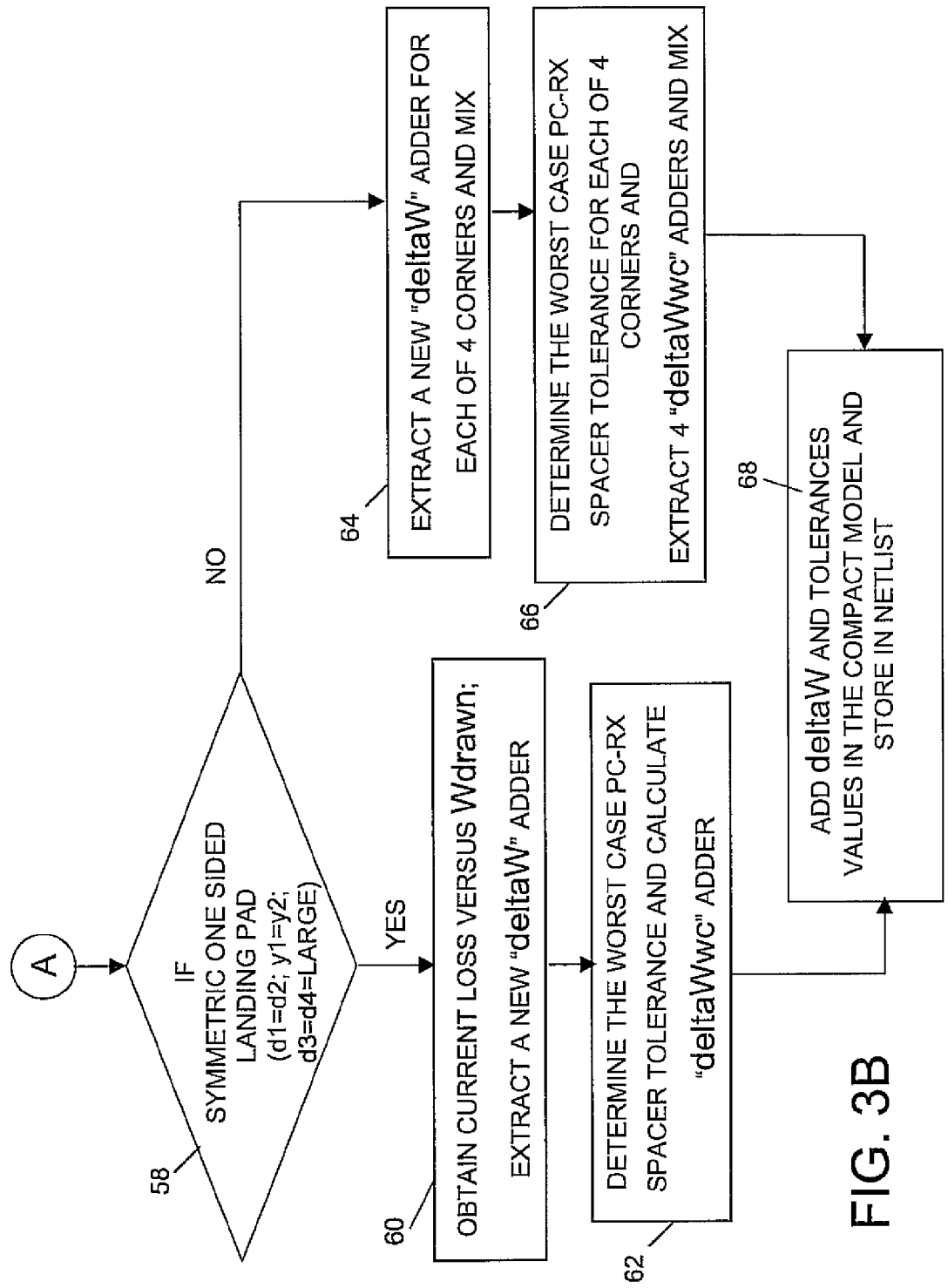

FIGS. 3A and 3B depict a generalized flow chart illustrating the process 50 for providing an extraction model when designing and optimizing semiconductor VLSI circuits including the semiconductor device (e.g., pFET) structure shown in FIG. 2. As shown in FIG. 3A, a first step 52 requires that for every device, the distances "d" and "y" between the PC landing pad region(s) and the RX edge (as shown in FIG. 2) are determined. With more particularity, netlist extraction is performed by a software program ("extractor") that reads information about a specific circuit. An extraction tool, such as Erie, Hercules or Calibre executes an extraction methodology that searches the drawn shapes of the device structure and looks for the PC/RX intersections, e.g., in north and south directions. The PC pad to RX distances, embodied in the variable "d" and "y" are obtained for modeling the proximity effects of landing pads on device parametrics for more accurately predicting device performance. It is understood that the RX to Landing Pad ("d") and landing pad end region edges to a midline PC landing distance ("y") modeling is repeated for each of the NW, NE, SW, SE corners of the structure.

Then, as indicated at step 54, FIG. 3A, a function is determined to depict the curvature of the PC pad and corner. As will be described in greater detail, this function for determining the landing pad rounding description is used to obtain the rounding deltaW and corresponding tolerances values. The deltaW adder equation and tolerances are then coded as a function of distance d in the dynamic link library (DLL) which may comprise C, TCL, Scheme or other coding schemes known in the art. Afterwards, using d, the deltaW and tolerances are obtained. It is understood that these deltaW and tolerances values are obtained for both sides of the structure for all four corners.

Figure 4B:
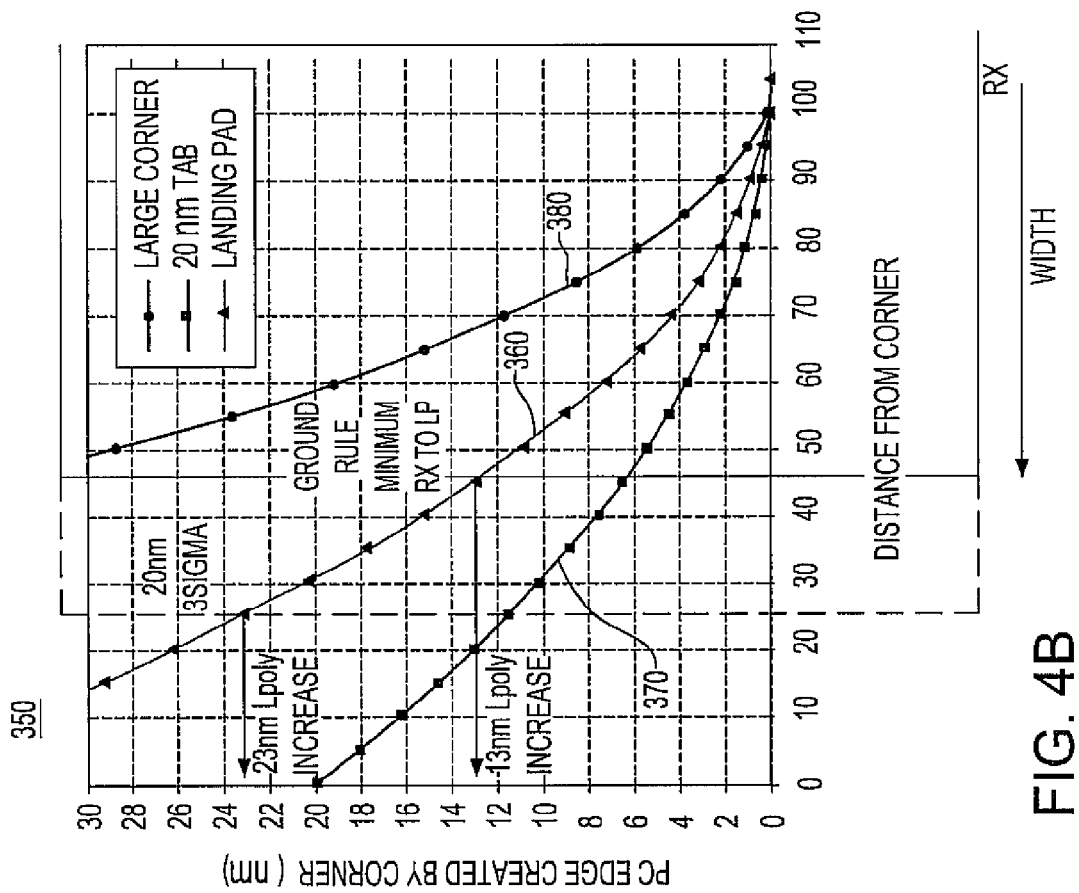
FIG. 4A depicts an example device structure for modeling the PC corner rounding effect and FIG. 4B depicts the PC pad poly rounding curvature for the example device structure of FIG. 4A.
Figure 4A:
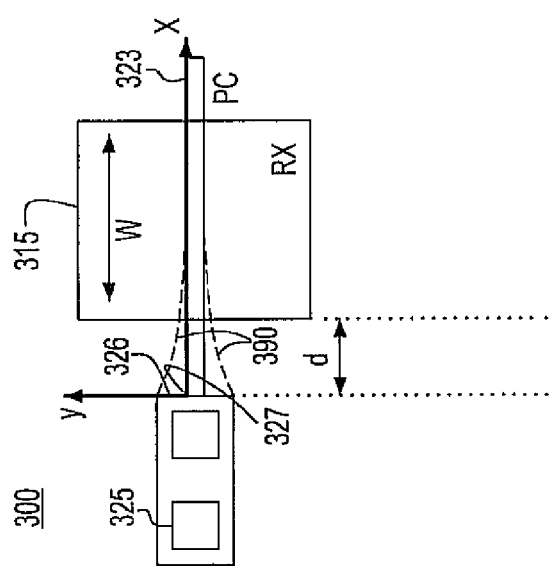

A model depicting the PC pad poly rounding curvature for the device structure of FIG. 2 is now shown in FIGS. 4A and 4B. After determining the PC pad to RX distances, e.g., embodied in the variables "d" and "y" that are obtained for modeling the proximity effects of landing pads on device parametrics for more accurately predicting device performance, simple geometric curves are implemented to obtain equations that represent edges of litho contours from landing pads for any combination of $d_n$, $y_n$.

In the circuit structure portion 300 shown in FIG. 4A, there is depicted the active device area 315, the poly PC layer having an interconnect portion 323 and landing pad feature 325 shown having two jogs 326 (two sides) each, for example, of 20 nm in length, along a vertical (y-axis). Further shown in FIG. 4A is a corner 327 defining a Landing Pad edge (jog) 326 from which is measured the RX to Landing Pad distance "d" along an x-axis, and which may be used to calculate the PC rounding edge 390 created by the corner. A minimum GroundRule (GR) distance d along the x-axis may be anywhere between 30 nm and 80 nm minimum for 45 nm technology.

A methodology is now presented that models how the PC lithographic contours may be used to determine landing pad rounding description and hence a starting point utilizing a polynomial equation to calculate the DeltaW effect. This method includes a first step that implements a simple function to depict the curvature of the PC landing pad and corner(s) as shown in FIGS. 4A and 4B. Particularly, a PC lithographic contour analysis is performed from which an analytical model formulation with input choices based on the lithographic contours analysis is developed. In one embodiment, a contour analysis model is a geometric function, e.g., a parabola, to determine the landing pad rounding description. In alternative embodiments, other geometric functions or combinations of functions (circles, triangles, etc.) may be used for the model; however, it has been determined that a parabolic function, e.g., a parabola, fits landing pad rounding effects better than a pure circle, for example.

FIG. 4B shows example curvature models 350 that may be used to calculate the RX edge created by one corner 327 as a function of the Lpoly distance from the corner 327 shown in FIG. 4A. For example, the plot 360 represented in FIG. 4B depicts the curvature as a function distance "d" of the RX edge to a symmetric Landing Pad with 20 nm jog on both sides (a northwest PC corner jog) as shown in FIG. 4A). In the example depicted, the side 326 northeast PC corner jog is the 20 nm landing pad jog. The plot 370 represented in FIG. 4B depicts the PC edge curvature for the model as shown in FIG. 4A with a 20 nm jog only on one side, as a function of the RX to Landing Pad edge distance "d"; the plot 380 represented in FIG. 4B depicts the PC edge curvature for the model as shown in FIG. 4A when the landing pad jog corner on both sides are infinitely increased. As can be seen in FIG. 4B, the resulting plot does not intersect the Y-axis representing an extremely large PC edge. From the example curvature models 350 plotted in FIG. 4B, it may be generalized that a long PC Edge created by corner 327 (e.g., edge y>=100 nm) can be represented by a circle as a function of $d_n$, $y_n$ while a shorter PC Edge created by corner 327 (e.g., y<=100 nm) can be represented by a parabola as a function of $d_n$, $y_n$. As will be described in greater detail herein below, each of the curvature models are obtained for every PC Landing Pad corner, e.g., for the northwest (NW), northeast (NE), southwest (SW), and southeast (SE) corner locations defined for the PC landing pad structure shown in FIG. 2.

Figure 5:
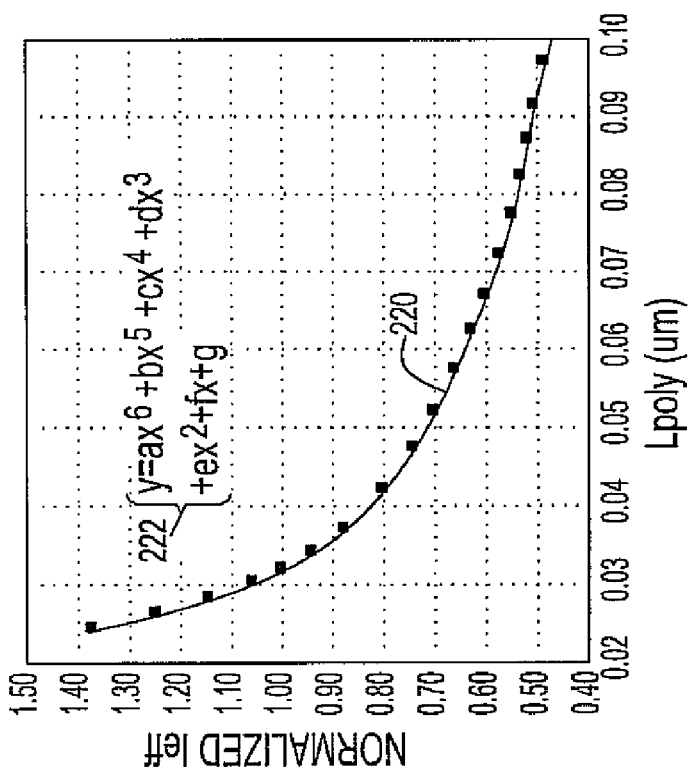
FIG. 5 is a plot depicting an example normalized FET $I_{eff}$ versus the $L_{poly}$ (the effective transistor channel length) response curve using a FET transistor device model according to the methodology of the invention.

Returning to FIG. 3A, step 55, there is depicted the step of obtaining the model FET current (Ieff) versus (poly length) L responses. In the step 55 of determining the model FET current ($I_{eff}$) (the effective channel current) versus $L_{poly}$ response function for a FET device (such as characterized by using 45 nm CMOS fabrication processes), there is first provided a plot of the normalized FET $I_{eff}$ versus the $L_{poly}$ (effective transistor channel length parameter). FIG. 5 depicts a starting point for the analysis conducted at step 55, FIG. 3A, which implements data of a normalized FET $I_{eff}$ versus the $L_{poly}$ (the effective transistor channel length) viewed as a plot 220. For this step, known base model currents vs Leff analytical polynomial fits are implemented, e.g., using an existing FET transistor device model. It is understood that other device model Ieff current versus $L_{poly}$ length may be used depending upon the application since the FET can be any of the various NFET or PFET technology offerings. It is readily observed from the plot 220 shown in FIG. 5 based on the example FET model how the normalized Ieff increases exponentially as the $L_{poly}$ length decreases. As shown by the plot depicted in FIG. 5, provided herein for exemplary purposes, the Ieff verses the $L_{poly}$ response curve 220 is modeled as a 6th order polynomial equation 222 (e.g., $y=ax^6+bx^5+cx^4+dx^3+ex^2+fx+g$ where a,b,c,d,e,f,g are all constants); however, it is understood that this equation may be modeled as any polynomial equation of nth degree order (n being a whole number) or any other function typical in compact models. Returning to FIG. 3A, there is depicted a next step 56 of obtaining the results of mixing the Ieff versus Lpoly response against the PC curvature (over active RX area of FIG. 4A) to determine the impact of corner rounding on the FET $I_{eff}$. This mixing is effectively a convolution (integration) of the modeled parabolic function or nth degree order polynomial equation representing the $I_{eff}$ (effective channel current) versus $L_{poly}$ response curve (modeled as equation 222 such as shown in FIG. 5), against the PC curvature portion over the RX area for the example FET device (modeled according to a curve such as shown in FIG. 4B) in order to calculate the change in current (current reduction) created by the landing pad rounding effects. It is understood that this step is performed for the general case at each landing pad corner, i.e., for the northwest (NW), northeast (NE), southwest (SW), and southeast (SE) locations defined for the PC landing pad structure.

As part of this device parametric algorithm, there may be further performed a step of calculating the gate area over RX from the extracted eight dimensional values: $d_n$ and $y_n$ where n=1, . . . ,4, as will be explained in greater detail herein below. Returning to step 58, in FIG. 3B, a determination is made to ascertain whether the landing pad technology is one-sided symmetric, e.g., characterized as having landing pad dimensions such as d1=d2; y1=y2; and d3=d4=large (>100 nm) in the example generalized device model 30 shown in FIG. 2. In order to simplify the methodology in technologies where there are only one-sided symmetric landing pads, a path comprising method steps 60, 62, and 68 is traversed. Step 60 depicts the further step of extracting a new deltaW adder. This step involves ascertaining the reduction of FET $I_{eff}$ (current) as a function of the RX width for the FET device structure modeled as depicted in the example structure shown in FIG. 4A.

Figure 6:
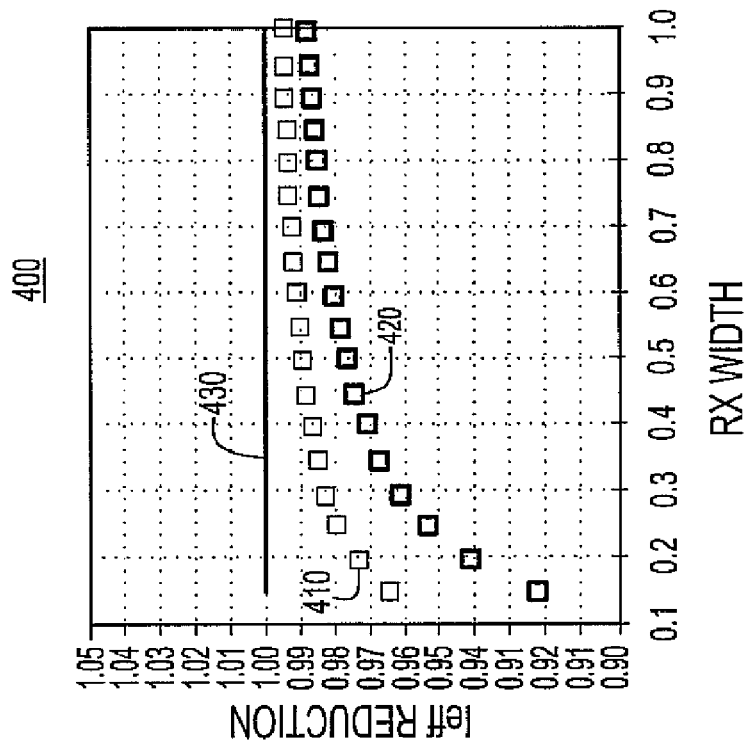
FIG. 6 depicts a plot 400 illustrating the results of the mixing (integration) of the modeled nth degree order polynomial function representing the $I_{eff}$ (effective channel current) versus $L_{poly}$ against the PC curvature portion over the RX area for a symmetric one-sided landing pad FET device; and, FIG. 7 depicts a plot of the deltaW response 450 as a function of the PC landing pad to RX distance "d" for the example symmetric one-sided landing pad FET device model depicted in FIG. 4A.
Figure 7:
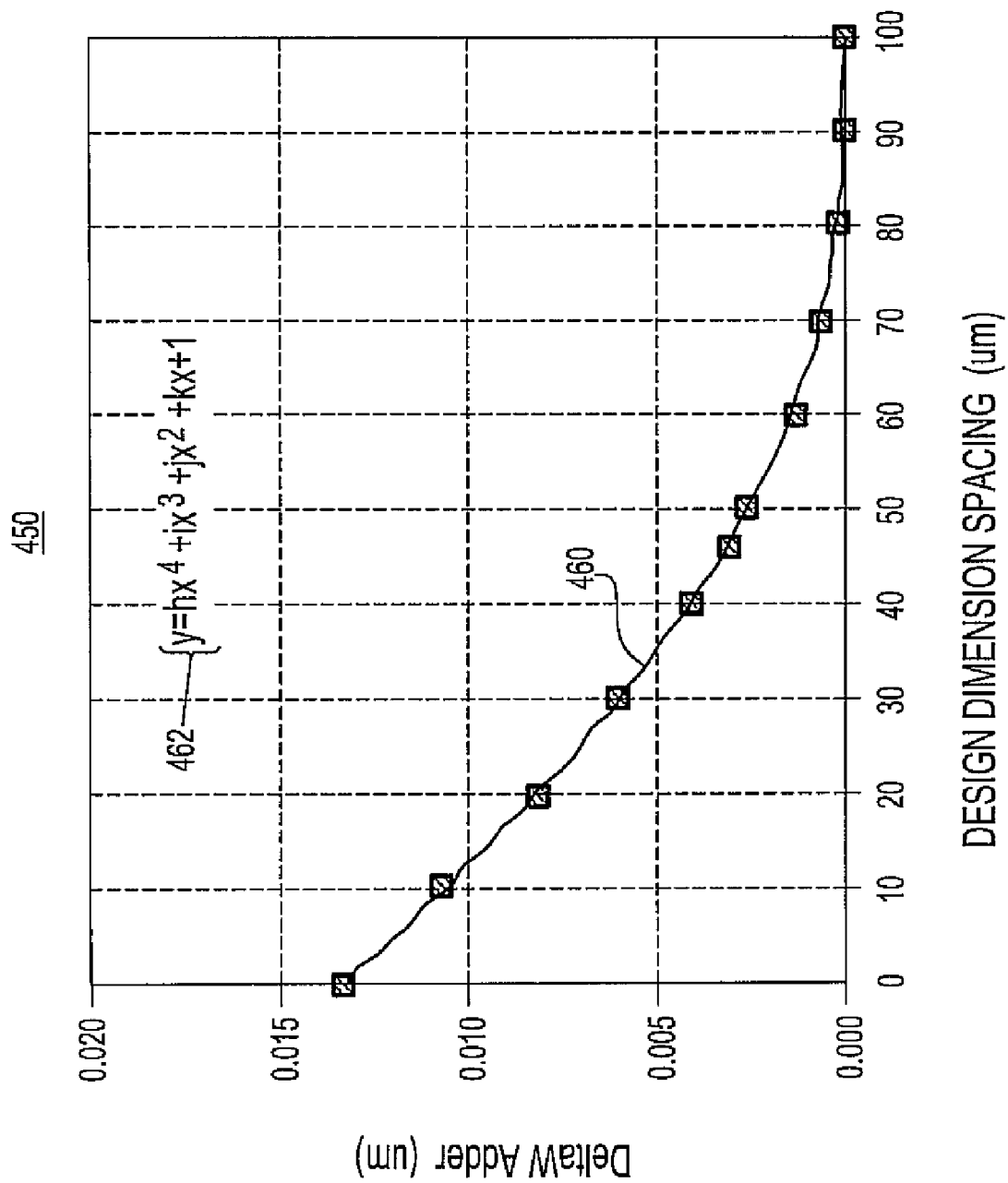

FIGS. 6 and 7 refer to the symmetric one-sided landing pad. FIG. 6 particularly depicts a plot 400 illustrating the results of the mixing (integration) of the modeled nth degree order polynomial equation representing the $I_{eff}$ (effective channel current) versus $L_{poly}$ response curve against the PC curvature portion over the RX area for the FET device as obtained at step 60, FIG. 3B, in order to calculate the current reduction created by the symmetric one-sided landing pad rounding effect for various values of the RX width. As shown in FIG. 6, a first example plot 410 is generated which represents the reduction of the FET $I_{eff}$ for a Lpoly region having a nominal PC-RX distance "d" of about 50 nm (y-axis) as a function of RX width (x-axis). FIG. 6 further depicts another example plot 420 representing the reduction of the FET $I_{eff}$ for a Lpoly region with the PC-RX distance of about 28 nm. As is clearly seen in both example plots 410, 420, the amount of $I_{eff}$ current reduction relative to a nominal current depicted as example current plot 430 in FIG. 6 decreases as the effective RX width increases as would be expected due to landing pad rounding phenomena (e.g., approaches nominal current curve 430); likewise, the amount of $I_{eff}$ current reduction increases as the effective RX width decreases. It is these parameters that are modeled to ensure accurate circuit design simulations of the extraction model to be described herein below.

Having calculated the changes, they can be programmed into and made part of the compact model net list. That is, according to one aspect of the invention, a relationship is obtained between the deltaW (effective change in RX width) and the distances from a respective PC landing pad to the RX edge of the device being modeled. Thus, returning to FIG. 3B, the process proceeds to step 68 where these deltaW values are added to the built-in deltaW as an adder in the compact model.

FIG. 7 depicts a plot of the deltaW response 450 for the example FET model depicted in FIG. 4A. As shown, a function 460, represented in the response curve depicted in FIG. 7 as a polynomial function (e.g., $4^{th}$ degree polynomial), is the additional RX width as a function of the distance away from the PC landing pad edge to the active area. For the simple case of the symmetric one-sided landing pad, these values are determined by exact equations, such as the example equation plotted as function 460, and take into account tolerances determined from process assumptions. These values may be stored in tabular or equation form, and preferably a form that enables the values to be quickly added to the base compact model numbers using the analytical formulation.

For the simple case of the symmetric one-sided landing pad the deltaW adder values can be stored in table format for use in various performance modeling and circuit design algorithms can be obtained. The deltaW is obtained from the percentage change in Ieff as an equivalent change in width. Note that in this case the typical definition is used in a compact model where a positive deltaW means that the effective width is reduced.

In one embodiment, a memory storage device can be used to store, e.g., in a table or other specified electronic format, the median deltaW adder values listed for various PC-RX distances "d" ranging from 0 nm to 110 nm. Additionally values corresponding to tolerance changes can be included, e.g., represented as 3-Sigma closer RX-PC (worst case) values and 3 Sigma farther RX-PC (best case) values. The step of determining the 3-Sigma closer and farther RX-PC values is depicted in FIG. 3B at step 62. It is understood that the worst case PC-RX spacer tolerance (e.g., 22 nm for landing pad) may be used to capture the tolerance of the deltaW adder.

The deltaW adder values may be easily integrated into a Compact Model flow and taken into account in the performance analysis executable by a programmed computing device. For example, for a typical PC-RX distance the median deltaW adder is 0.0053 um, the worst case deltaW adder is 0.0118 um, and the best case deltaW adder is 0.0014 um. For a design manual deltaW of −0.01+/−0.01 which is typically derived from devices where the corner rounding effect is not present, the new median may be calculated as −0.01+ 0.0053=−0.0047. Then the new tolerances may be calculated by combining the design manual deltaW from the standard devices where the corner rounding is not present and statistically averaging them with the cases where the PC-RX is present for a given distance. For example, using root sum squared (RSS) one can get the worst case high tolerance values as RSS[+0.01 with +(0.0118−0.0053)] and the low tolerance as RSS[−0.01 with +(0.0014−0.0053)].

Returning to step 58, in FIG. 3B, if the device structure is not symmetric or one-sided, then the path in the method flow chart depicted at steps 64, 66, and 68 is traversed. In this analysis path, it is understood that there is further performed a step of calculating device parametrics. Thus, for examples, as the model depicted in the FIG. 4A relates to a single edge.(e.g. a northeast PC corner jog), the total impact is the sum of the four possible PC landing pad corners, e.g., NW, NE, SW, and SE corners defined for the PC landing pad structures. Thus, the calculated net Leff (device RX width) changes must be appropriately summed for the remaining PC jog corners (e.g., a NW northwest, SE and SW corners). For instance, after calculating the DeltaW impact at the NW corner (FIGS. 2, 4A), the process repeats to calculate the net DeltaW impact at the remaining NE, SW and SE corners, which results, if any, would be added to the Leff value (steps 64, 66). As a result of performing this step at each corner, a total combined DeltaW impact is a sum of the four possible PC corners. Thus, returning to FIG. 3B, in this path, the process ends at step 68 where these deltaW values are added to the built-in deltaW as an adder in the compact model.

The method of the present invention may be used in a circuit simulation run, such as performed by SPICE, or like simulation tool, with the circuit designer providing a description of the circuit known (netlist), with transistor models being updated as required by the updated netlist generated in accordance with the techniques of the invention. In this respect, a circuit designer may choose a model for the various circuit elements and their parameter values, and specifies the desired analysis, which determines what kind of simulation will be performed. Simulating the behavior of a MOSFET according to the invention, the netlist used in the simulation will include the deltaW and tolerances, as calculated herein, to describe the characteristics of the MOSFET. The netlist extraction is performed by a software program ("extractor") that reads information about a specific circuit. The information is typically stored in textual, graphical, tabular, or other electronic data storage formats so that the layout information that it represents can be easily modified.

It is further understood that the active semiconductor devices such as a MOSFET described in the present invention are modeled using compact models, analytic descriptions of device electrical behavior as a function of input conditions as well as device geometry and doping. A number of compact MOSFET models have been proposed, the most popular models for submicron integrated circuit applications are currently the BSIM3 and newer BSIM4 model.

Moreover, the teachings of the present invention may be used to calculate other device parametrics that are similar to Ieff. For instance, the method of the invention may be used to model the effects of corner rounding on device parametrics such as Idlin or Ioff which have fourth order polynomial or exponential decay fits to the BSIM curves, respectively, and use those instead of Ieff. Then the whole algorithm flow is keyed to Idlin (identical to Ieff) or Ioff. Except that the Idlin-L is different from Ieff-L is different from Ioff-L. Other device parametrics may be calculated based on the new active areal calculations of device lengths and widths. For example, a new calculated transistor gate capacitance Cgate can be obtained. It would use the intersection area between the PC and RX from direct intersect area calculations IntPCRXArea available in extractors such as Hercules, Calibre, etc. after accounting for corner rounding. The new calculated Cgate may now be represented with a change factor based on the gate area ratio to nominal area obtained as Leff×Weff. For instance, the Cgate change factor is simply Cgatenew= Cgateold*(IntPCRXArea/Leffold*Weffold). The IntRXPC-Area values are calculated using intersect areas of the "geometric corner rounded" areas (based on analytical calculations) while the "old" values are from BSIM standard models given the layout extraction for a given L and W.

The system and method of the present disclosure may be implemented and run on a general-purpose computer or computer system. The computer system may be any type of known or will be known systems and may typically include a processor, memory device, a storage device, input/output devices, internal buses, and/or a communications interface for communicating with other computer systems in conjunction with communication hardware and software, etc.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A computer-implemented method for modeling performance of a semiconductor transistor device structure having an active device area, a gate structure, and including a conductive line feature connected to said gate structure and disposed above said active device area, said conductive line feature including a first conductive landing pad feature disposed near an edge of said active device area, the method comprising the steps of:
   a) modeling, by a processor device, said transistor device structure, said modeling including determining a polynomial function for calculating a lithographic rounding effect of said first landing pad feature as a function of distance between an edge defined by said first landing pad feature to an edge of said active device area;
   b) obtaining, by said processor device, a function representing a current flow modification created by said lithographic rounding effect as a function of an effective length of said conductive line feature;
   c) providing to said processor device said obtained current flow modification as a function of a width of said active device area; and,
   d) relating, by said processor device, an effective change in active device area width (deltaW adder) with a distance from an edge defined by said first landing pad feature to an edge of said active device area of the transistor device being modeled; and,
   e) updating, by said processor device, transistor model parameter values in a transistor compact model for said transistor device to include deltaW adder values to be added to a built-in deltaW value, wherein a netlist used in a simulation include the deltaW adder values to describe the characteristics of the transistor device,
wherein effects of lithographic rounding effect of said first landing pad feature on transistor device parametrics is modeled.

2. The computer-implemented method as claimed in claim 1, wherein said step of obtaining a function representing a current flow modification comprises:
providing, by said processor device, a current response function that models current flow through said gate structure as a function of the effective length of said conductive line feature; and,
mixing, by said processor device, said current response function with said first polynomial function.

3. The computer-implemented method as claimed in claim 2, wherein said current flow modification includes a current decrease due to said lithographic rounding effect of said first landing pad feature.

4. The computer-implemented method as claimed in claim 1, wherein said modeling of said lithographic rounding effect according to said polynomial function comprises: performing a lithographic contour analysis for providing input data to be used in said modeling.

5. The computer-implemented method as claimed in claim 4, wherein said input data for said analytical model representation comprises a distance "d" between an edge defined by said landing pad feature to an edge of said active device area.

6. The computer-implemented method as claimed in claim 4, wherein said input data for said analytical model representation comprises a corner jog length "y" between a top or bottom edge of said first landing pad feature to an axis defined by said conductive line feature, said d and y lengths used in modeling said lithographic rounding effect.

7. The computer-implemented method as claimed in claim 6, wherein said conductive line feature connected to said gate structure extends beyond respective opposing edges of said active device area and includes said first landing pad feature and a second landing pad feature disposed proximate a respective edge of said active device area and each first and second landing pad feature having one or more corners defining a jog length, wherein said input data for said analytical model representation comprises determining, by said processor device, a distance "d" between an edge defined by each said first and second landing pad feature to an edge of said active device area and a respective jog length "y" for every corner defined by each said first and second landing pad feature, said lithographic rounding effect calculated by said processor device for each said corner of said first and second landing pad feature based on said calculated distances.

8. The computer-implemented method as claimed in claim 4, wherein said polynomial function is a parabola.

9. The computer-implemented method as claimed in claim 4, wherein said polynomial function is a $n^{th}$ degree polynomial function, where "n" is a whole number.

10. The computer-implemented method as claimed in claim 2, wherein said mixing comprises:
integrating, by said processor device, said current response function with said polynomial function over said active device area to calculate a current reduction created by said lithographic rounding effect; and,
correlating, by said processor device, values representing the calculated reductions in current as a function of said active device area width.

11. The computer-implemented method as claimed in claim 1, further comprising:
generating compact model parameters used in modeling a circuit comprising said transistor device structure, said compact model parameters including said changes in width of said active device area quantified as a function of said distance to be added to base compact model values for use in quantifying the influence of the lithographic rounding effect of said landing pad feature when modeling said transistor device structure.

12. A computer-implemented method for modeling a semiconductor transistor device structure having an active device area, a gate structure, and including a conductive line feature connected to said gate structure and disposed above said active device area, said conductive line feature including a first landing pad feature disposed near an edge of said active device area, the method comprising the steps of:
determining, by a processor device, a distance between an edge defined by said first landing pad feature to an edge of said active device area;
determining, by said processor device, from a modeling function that models a lithographic rounding effect of said first landing pad feature, changes in width of said active device area as a function of said distance between an edge defined by said landing pad feature to an edge of said active device area; and,
relating, by said processor device, an effective change in active device area width (deltaW adder) with a distance from an edge defined by said first landing pad feature to an edge of said active device area of the transistor device being modeled; and,
updating, by said processor device, transistor model parameter values in a transistor compact model for said transistor device to include deltaW adder values to be added to a built-in deltaW value, wherein a netlist used in a simulation include the deltaW adder values to describe the characteristics of the transistor device,
wherein effects of lithographic rounding effect of said first landing pad feature on transistor device parametrics is modeled.

13. The computer-implemented method as claimed in claim 12, wherein said step of determining changes in width of said active device area as a function of said distance between an edge defined by said first landing pad feature to an edge of said active device comprises:
determining, by said processor device, a polynomial function for calculating a lithographic rounding effect of said first landing pad feature as a function of said distance;
obtaining, by said processor device, a function representing a current flow modification created by said lithographic rounding effect as a function of an effective length of said conductive line feature;
providing said obtained current flow modification as a function of a width of said active device area; and,
generating, by said processor device, netlist parameter values representing a change in width of said active device area as a function of said distance between an edge defined by said first landing pad feature to an edge of said active device area,
wherein said changes in width of said active device area are quantified as a function of said distance and adapted for addition to an analytical model representation to account for the transistor performance impact of said lithographic rounding effect of said first landing pad feature.

14. The computer-implemented method as claimed in claim 13, wherein said obtaining a function representing a current flow modification comprises:
providing, by said processor device, a current response function that models current flow through said gate structure as a function of the effective length of said conductive line feature; and,
mixing, by said processor device, said current response function with said first polynomial function.

15. The computer-implemented method as claimed in claim 14, wherein said current flow modification includes a current decrease due to said lithographic rounding effect of said first landing pad feature.

16. The computer-implemented method as claimed in claim 14, wherein said modeling of said lithographic rounding effect according to said polynomial function comprises: performing a lithographic contour analysis for providing input data to be used in said modeling, said input data for said analytical model representation comprising a distance "d" between an edge defined by said first landing pad feature to an edge of said active device area.

17. The computer-implemented method as claimed in claim 16, wherein said input data for said analytical model representation comprises a corner jog length "y" between a top or bottom edge of a landing pad feature to an axis defined by said conductive line feature, said d and y lengths used in modeling said lithographic rounding effect.

18. The computer-implemented method as claimed in claim 17, wherein said conductive line feature connected to said gate structure extends beyond respective opposing edges of said active device area and includes said first landing pad feature and a second landing pad feature disposed proximate a respective edge of said active device area and each first and second landing pad feature having one or more corners defining a jog length, wherein said input data for said analytical model representation comprises determining a distance "d" between an edge defined by each said first and second landing pad feature to an edge of said active device area and a respective jog length "y" for every corner defined by each said first and second landing pad feature, said lithographic rounding effect calculated for each said corner of said first and second landing pad feature based on said calculated distances.

19. The computer-implemented method as claimed in claim 13, wherein said polynomial function is a parabola.

20. The computer-implemented method as claimed in claim 13, wherein said polynomial function is a $n^{th}$ degree polynomial function, where "n" is a whole number.

21. A program storage device readable by a machine, tangibly embodying a program of instructions executable by the machine to perform method steps for modeling a semiconductor transistor device structure having an active device area, a gate structure, and including a conductive line feature connected to said gate structure and disposed above said active device area, said conductive line feature including a first landing pad feature disposed near an edge of said active device area, the method comprising the steps of:
an extracting means for determining a distance between an edge defined by said first landing pad feature to an edge of said active device area;
determining from a modeling function that models a lithographic rounding effect of said first landing pad feature, changes in width of said active device area as a function of said distance between an edge defined by said first landing pad feature to an edge of said active device area; and,
relating an effective change in active device area width (deltaW adder) with a distance from an edge defined by said first landing pad feature to an edge of said active device area of the transistor device being modeled; and,
updating transistor model parameter values in a transistor compact model for said transistor device to include deltaW adder values to be added to a built-in deltaW value, wherein a netlist used in a simulation include the deltaW adder values to describe the characteristics of the transistor device,
wherein effects of lithographic rounding effect of said first landing pad feature on transistor device parametrics is modeled.

22. The program storage device readable by a machine as claimed in claim 21, wherein said step of determining changes in width of said active device area as a function of said distance between an edge defined by said first landing pad feature to an edge of said active device comprises:
determining a polynomial function for calculating a lithographic rounding effect of said first landing pad feature as a function of said distance;
providing a current response function that models current flow through said gate structure as a function of an effective length of said conductive line feature;
mixing said current response function with said first polynomial function to obtain a function representing a current flow modification created by said lithographic rounding effect versus the effective length of said conductive line feature;
providing said obtained current flow modification as a function of a width of said active device area; and,
generating netlist parameter values representing a change in width of said active device area as a function of said distance between an edge defined by said first landing pad feature to an edge of said active device area,
wherein said changes in width of said active device area are quantified as a function of said distance and adapted for addition to an analytical model representation to account for the transistor performance impact of said lithographic rounding effect of said first landing pad feature.

23. The program storage device readable by a machine as claimed in claim 22, wherein said current flow modification includes a current decrease due to said lithographic rounding effect of said first landing pad feature.

24. The program storage device readable by a machine as claimed in claim 22, wherein said modeling of said lithographic rounding effect according to said polynomial function comprises: performing a lithographic contour analysis for providing input data to be used in said modeling, said input data for said analytical model representation comprising a distance "d" between an edge defined by said first landing pad feature to an edge of said active device area.

25. The program storage device readable by a machine as claimed in claim 24, wherein said input data for said analytical model representation comprises a corner jog length "y" between a top or bottom edge of said first landing pad feature to an axis defined by said conductive line feature, said d and y lengths used in modeling said lithographic rounding effect.

26. The program storage device readable by a machine as claimed in claim 25, wherein said conductive line feature connected to said gate structure extends beyond respective opposing edges of said active device area and includes said first landing pad feature and a second landing pad feature disposed proximate a respective edge of said active device area and each first and second landing pad feature having one or more corners defining a jog length, wherein said input data for said analytical model representation comprises determining a distance "d" between an edge defined by each said first and second landing pad feature to an edge of said active device area and a respective jog length "y" for every corner defined by each said first and second landing pad feature, said lithographic rounding effect calculated for each said corner of said first and second landing pad feature based on said calculated distances.

27. The program storage device readable by a machine as claimed in claim 22, wherein said modeling function is a polynomial function.

28. The program storage device readable by a machine as claimed in claim 22, wherein first polynomial function is a $n^{th}$ degree polynomial function, where "n" is a whole number.

\* \* \* \* \*